United States Patent

Scott

[11] 4,045,870
[45] Sept. 6, 1977

[54] SOCKET INSERTER

[75] Inventor: Eldred D. Scott, Laguna Hills, Calif.

[73] Assignee: Precision Engineered Products, Inc., Orange, Calif.

[21] Appl. No.: 763,313

[22] Filed: Jan. 28, 1977

[51] Int. Cl.² ............................................. H05K 3/30
[52] U.S. Cl. ..................................... 29/741; 29/626; 29/759
[58] Field of Search ................. 29/739, 740, 741, 759, 29/626

[56] References Cited

U.S. PATENT DOCUMENTS

| | | | |
|---|---|---|---|
| 2,968,809 | 1/1961 | Foreman et al. | 29/741 X |
| 3,564,691 | 2/1971 | Ackerman | 29/741 X |

*Primary Examiner*—Carl E. Hall
*Attorney, Agent, or Firm*—Gordon L. Peterson

[57] ABSTRACT

An apparatus for inserting a socket into a printed circuit board comprising a supporting structure, first and second resilient fingers attached to the supporting structure, and a socket holding mechanism. The resilient fingers are adapted to receive and releasably retain a socket therebetween at a socket retaining station. The socket holding mechanism is mounted on the supporting structure for movement from a first position on the side of the socket retaining station remote from the printed circuit board toward the printed circuit board along a path which passes through the socket retaining station and between the resilient fingers. As the socket holding mechanism passes through the socket retaining station, the socket is removed from the resilient fingers and coupled to such mechanism so the socket holding mechanism can move the socket to the circuit board.

17 Claims, 7 Drawing Figures

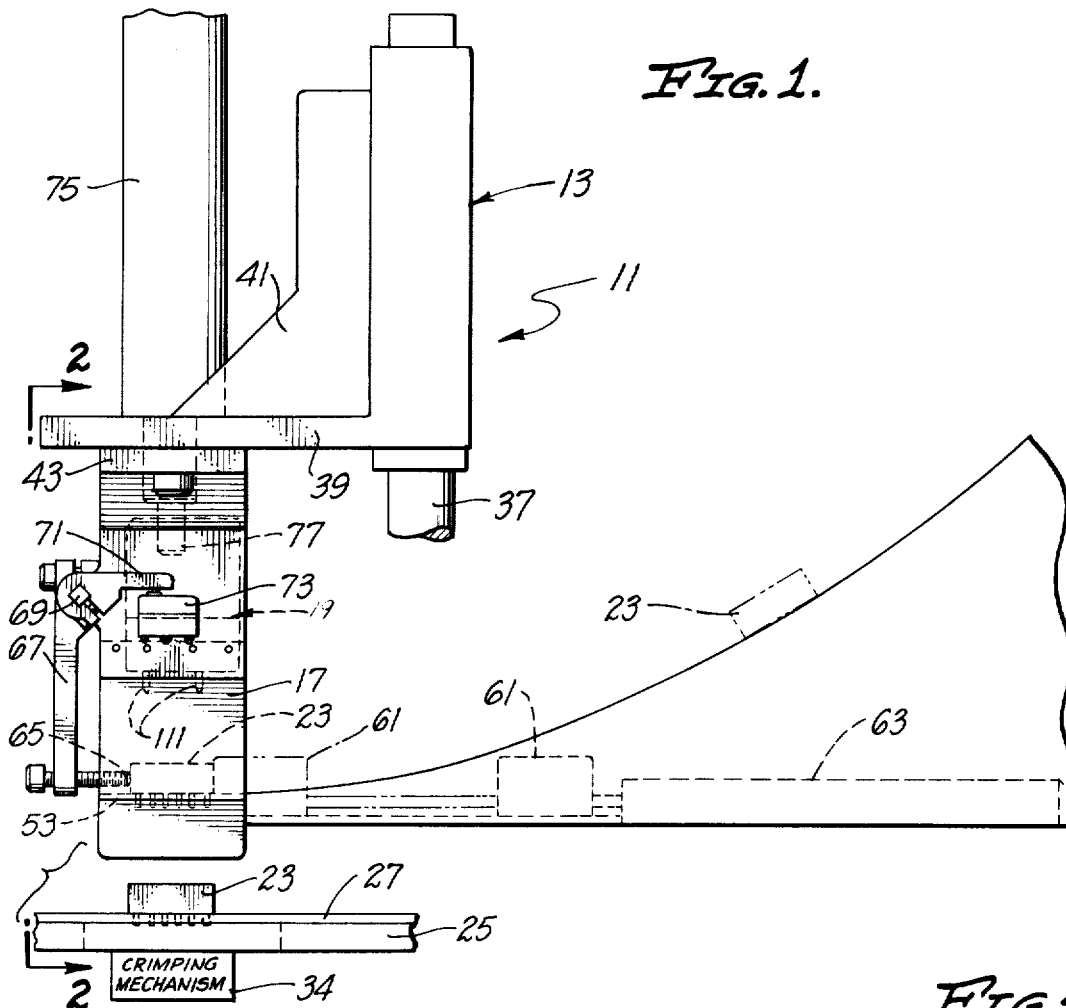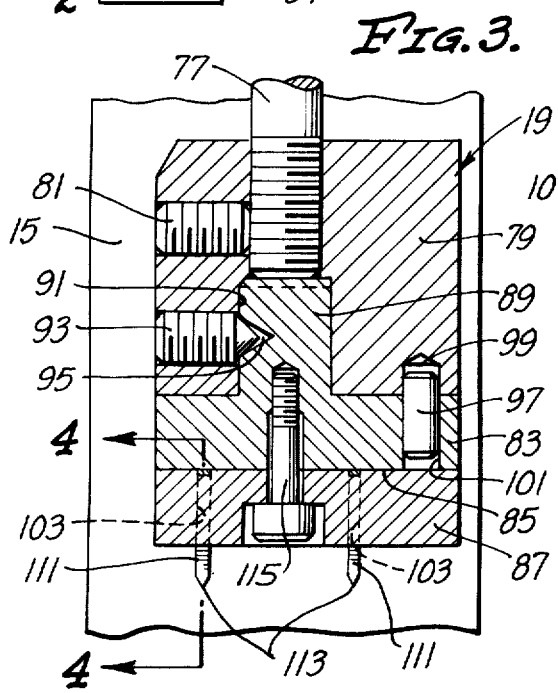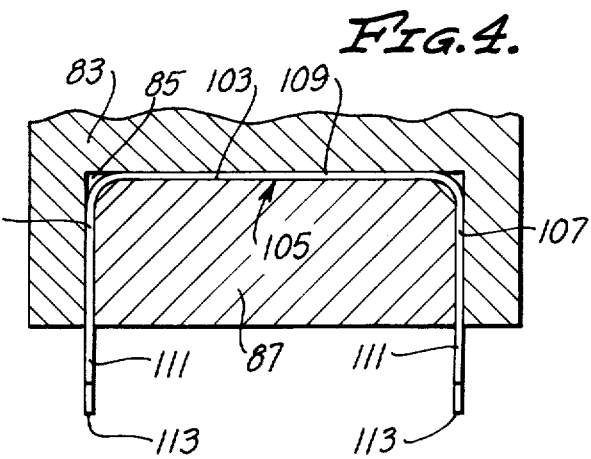

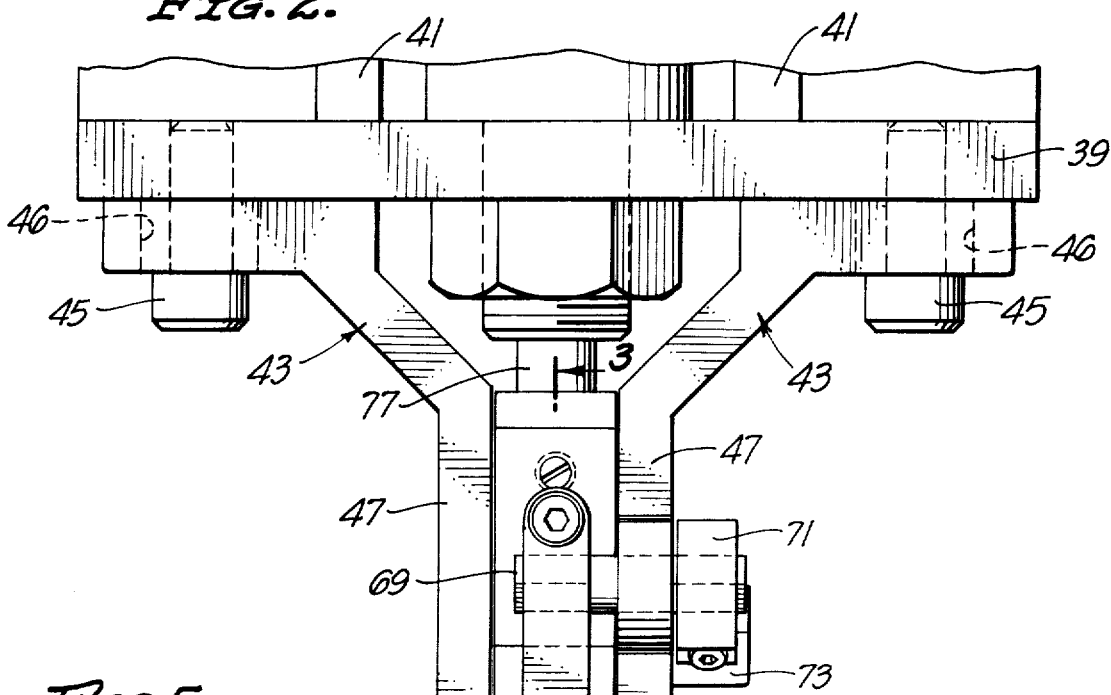
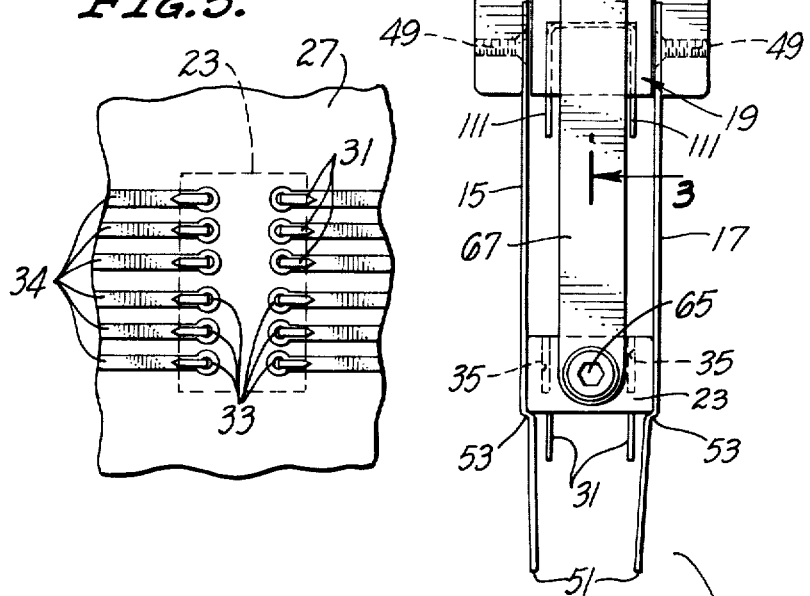
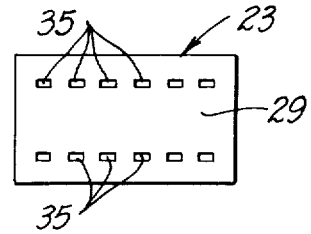
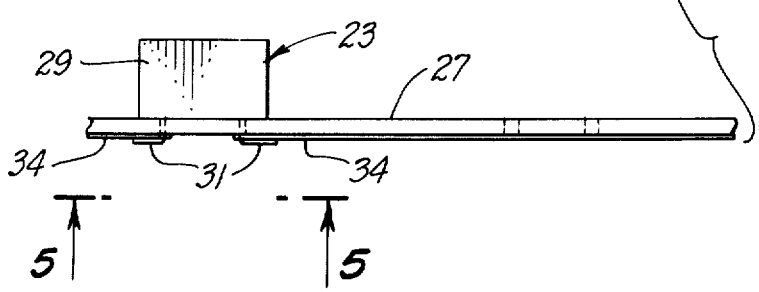
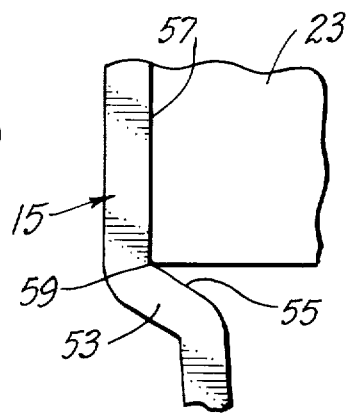

SOCKET INSERTER

BACKGROUND OF THE INVENTION

In the assembly of many electronic components, it is necessary to mount sockets on a base, such as a printed circuit board. A socket of this type includes a housing having a series of apertures opening on one face and a series of bendable pins extending from the opposite face. To mount the socket on the board, the pins are inserted into correspondingly sized and arranged holes in the board. The socket is attached to the board, for example, by bending the pins and/or soldering the pins to the board. With the socket mounted in this fashion, the apertures of the socket are exposed and can receive another electronic element, such as a dual in-line package. The socket electrically and mechanically couples the dual in-line package to other circuit elements.

Heretofore, the task of socket insertion has been accomplished manually. Because the pins of the socket and the holes in the board are small, the insertion process is difficult and time consuming. Consequently, carrying out this task manually increases the labor cost.

Equipment is available for inserting the dual in-line packages into the sockets. Such equipment uses a vacuum to hold the dual in-line package during insertion. However, vacuum holding techniques are not suited for use with sockets because the apertures of the sockets are air-pervious, and accordingly, it is difficult or impossible to obtain sufficient differential pressure across the socket.

SUMMARY OF THE INVENTION

The present invention provides an apparatus for accurately and rapidly inserting sockets into various bases, such as printed circuit boards. This is accomplished without the use of vacuum to hold the socket during the insertion process.

With this invention, the socket is inserted by a socket holding mechanism which itself is inserted into the socket. The socket holding mechanism can advantageously be in the form of a plug which can be received by the socket to mechanically couple the socket to the socket holding mechanism. With the socket releasably coupled to the socket holding mechanism, the latter can deliver the socket to the desired location on the printed circuit board.

The apparatus may include retaining means for releasably retaining the socket at a socket retaining station with the pressure in the socket being at a predetermined location. The socket holding mechanism is mounted for movement from a first position located on the side of the socket retaining station remote from the printed circuit board along a path which extends through the socket retaining station and toward the printed circuit board. The socket holding mechanism may include at least one protrusion sized to be received in one of the apertures of the socket and adapted to be releasably retained therein.

With the arrangement described above, movement of the socket holding mechanism through the socket retaining station automatically results in releasably mechanically coupling the socket to the socket holding mechanism. Specifically, the protrusion of the socket holding mechanism is frictionally received in the aperture of the socket holding mechanism. No vacuum, special clamps, or fasteners are needed to provide this mechanical couple. In addition, the process can be carried out very rapidly in that the socket holding mechanism can move continuously through the socket retaining station without stopping. The number of the protrusions on the socket holding mechanism is not critical; however, at least two of the protrusions is preferred so that the forces on the socket will remain balanced as the protrusions are being inserted, and four of the protrusions are considered optimum in this regard.

Another feature of the invention is that the retaining means for the socket can advantageously include first and second resilient fingers. At least portions of the fingers are spaced apart so a socket can be received and retained between them. With this arrangement, a socket can be moved laterally into the socket retaining station between the resilient fingers. The fingers have free ends spaced from the printed circuit board. The socket holding mechanism preferably lies between the fingers and moves toward the free ends of the fingers to thereby release the socket from the fingers. Accordingly, the fingers automatically release the socket in response to movement of the socket downwardly beyond the free ends of the fingers.

Another important function of the resilient fingers is to assist in the positioning of the socket. This can be advantageously accomplished by providing first and second shoulders on the first and second fingers, respectively. The socket can rest on the shoulders with the shoulders positioning the socket along one axis and assuring that the socket is not tilted.

The socket is positioned along the above-mentioned axis by pushing it against a stop, and accordingly, the socket and all of the apertures occupy predetermined locations. This is particularly important when the resilient finger feature of this invention is combined with a socket holding mechanism of the type that includes protrusions for insertion into the apertures of the socket. Because the socket apertures and the protrusions of the socket holding mechanism are relatively small, precise positioning is essential to assure that the apertures lie in the path of movement of the protrusions.

As the socket holding mechanism moves through the socket retaining station, a certain amount of force is required to insert the protrusions of the socket holding mechanism into the apertures of the socket. Another function of the shoulders on the resilient fingers is to support the socket sufficiently so that the protrusions can be inserted into the apertures of the socket as the socket holding mechanism moves through the retaining station.

Another function of the resilient fingers is that they must resiliently spread apart to release the socket. Although this can be brought about in different ways, in the preferred embodiment, the shoulders are slightly inclined to define cam surfaces. The force of the socket being urged against the cam surfaces of the shoulders tends to cam the resilient fingers apart. The cam angle and the resilience of the fingers are selected so that the fingers will not be cammed apart to release the socket until after the socket has been adequately coupled to the socket holding mechanism.

As indicated above, in feeding the sockets to the socket retaining station, the socket is urged between the fingers and against a stop. The resilient fingers may or may not resiliently grip the socket. However, if the resilient fingers lightly resiliently grip the socket, the socket is prevented from bouncing back off of the stop. Thus, although the resilient fingers are of very simple and very inexpensive construction, they nevertheless perform a wide variety of important functions.

The socket holding mechanism can be moved along a path through the socket retaining station in various different ways. For example, this movement can advantageously be brought about by a linear actuator, such as a hydraulic or pneumatic actuator. Means responsive to the engagement of the socket and the stop operate the actuator to move the socket holding mechanism.

The present invention also provides for constructing the socket holding mechanism in a particular manner to bring about certain advantageous results. For example, the socket holding mechanism may include an elongated wire bent into a configuration having at least one leg and one web, a receiver having a surface defining a channel, and a mounting block sized to be received in the channel. At least one of the channel and the mounting block have a groove therein adapted to at least partially receive the wire. Means is provided for attaching the mounting block to the receiver with the mounting block being in the channel and the wire being in the groove. The leg projects from the mounting block and the receiver to define the protrusion referred to above. The mounting block and the receiver hold the web in the groove.

With the above-described construction, if the leg should become bent during use, it can be easily replaced. In addition, the wire can advantageously be bent into a channel shaped configuration having two legs integrally joined by the web. In this event, each of the legs defines one of the protrusions so that two protrusions are formed from a single wire.

The invention, together with further features and advantages thereof, may best be understood by reference to the following description taken in connection with the accompanying illustrative drawing.

BRIEF DESCRIPTION OF THE DRAWING

FIG. 1 is a fragmentary side elevational view of a socket inserter constructed in accordance with the teachings of this invention.

FIG. 2 is an enlarged, fragmentary elevational view taken generally along line 2—2 of FIG. 1.

FIG. 3 is an enlarged, fragmentary sectional view taken generally along line 3—3 of FIG. 2.

FIG. 4 is an enlarged, fragmentary sectional view taken generally along line 4—4 of FIG. 3.

FIG. 5 is a fragmentary bottom plan view taken generally along line 5—5 of FIG. 2.

FIG. 6 is a plan view of a socket of the type which can be inserted using this invention.

FIG. 7 is an enlarged, fragmentary view of one of the resilient fingers with a socket resting thereon.

DESCRIPTION OF THE PREFERRED EMBODIMENT

FIGS. 1 and 2 show a socket inserter 11 which generally comprises a supporting structure 13, resilient fingers 15 and 17 attached to the supporting structure, a socket holding mechanism 19, and a loading mechanism 21 for sequentially loading sockets 23 into a socket retaining station between the resilient fingers. The socket inserter 11 also includes a table or frame 25 on which a suitable base, such as a printed circuit board 27, is suitably mounted. To enable the socket inserter 11 to insert sockets 23 at various locations in the board 27, the socket inserter must provide for some relative movement between the board 27 and the socket inserter 11.

Although this could be accomplished in different ways, in the embodiment illustrated, the supporting structure 13 remains fixed and an X-Y table (not shown) is used to position the table 25 and the printed circuit board 27 in a horizontal plane beneath the resilient fingers 15 and 17. Although the printed circuit board 27 is provided beneath the resilient fingers 15 and 17 in the embodiment illustrated, it should be understood that the socket inserter 11 can be used in other orientations.

With reference to FIGS. 1, 2, 5 and 6, it can be seen that the socket 23 includes a housing 29 and a plurality of pins 31 projecting downwardly from the housing in two parallel rows. The printed circuit board 27 has an equal number of holes 33 sized and arranged to receive the pins 31, respectively. The holes 33 are of small diameter and only slightly oversized with respect to the pins 31. The primary function of the socket inserter 11 is to insert the pins 31 into predetermined ones of the holes 33 to thereby accurately locate the socket on the board 27. Following the insertion operation, the socket 23 is attached to the board in any suitable manner, such as by crimping the pins 31 as shown in FIGS. 2 and 5. The crimping operation can be carried out by a standard crimping mechanism 32 (FIG. 1) which bends the pins over to hold the socket in the printed circuit board. As shown in FIG. 5, the bent over pins 31 may be coupled to conductive leads 34 on the printed circuit board 27.

The upper face of the housing 29 of the socket 27 has apertures 35 (FIG. 6) arranged in two parallel rows. The apertures 35, in the embodiment illustrated, are adapted to receive and resiliently hold correspondingly sized and arranged pins of a dual in-line package. Thus, the socket 27 includes resilient means (not shown) with the housing 29 associated with each of the apertures 35 for retaining an appropriately shaped pin therein.

The socket 23, as described herein, is of conventional, commercially available construction. It should be understood, of course, that the socket inserter 11 can be used to insert sockets having other numbers and configurations of pins 31 and apertures 35.

The supporting structure 13 can be of any configuration which is suitable for mounting the various components of the socket inserter 11. In the embodiment illustrated, it includes a post 37 (FIG. 1) and a platform 39 mounted on the post and further supported by a pair of brackets 41. A pair of finger supports 43 are attached to the platform 39 in any suitable manner, such as by a pair of screws 45 which extend through oversized slots 46 in the finger supports. This permits the space between the finger supports to be adjusted. The finger supports 43 include spaced parallel legs 47 which project straight downwardly from the platform 39.

The resilient fingers 15 and 17 are attached to the lower ends of the finger supports 43, respectively, in any suitable manner, such as by screws 49. Preferably the inner surfaces of each of the resilient fingers 15 and 17 are flush with the associated inner surface of the leg 47 and the head of the screw 49.

The resilient fingers 15 and 17 are spaced apart, generally parallel, and project straight downwardly from the finger supports 43 toward the printed circuit board 23. Each of the resilient fingers 15 and 17 terminates in a free end 51 which is spaced above the printed circuit board 27 a distance which exceeds the height of the socket 23 above the circuit board when the socket is inserted in the circuit board. This enables the printed circuit board 27 to be moved laterally relative to the free ends 51 after a socket has been inserted into the board.

Each of the resilient fingers 15 and 17 has a shoulder 53 (FIGS. 2 and 7). Each of the shoulders 53 has an inner cam surface 55 which slopes downwardly at, for example, a 30° angle as it extends inwardly. The cam surface 55 breaks away from an inner surface 57 immediately thereabove along a line 59. The lines 59 for the resilient fingers 15 and 17 are preferably parallel and lie in the same horizontal plane.

Each of the fingers 15 and 17 is resilient and is preferably constructed of a resilient metal, such as spring steel. Each of the fingers is in the form of a relatively thin, flat blade. Accordingly, the fingers 15 and 17 can be resiliently deflected toward and away from each other.

One important function of the resilient fingers is to retain one of the sockets 23 in a predetermined position. This is accomplished by feeding one of the sockets laterally from a location alongside the fingers 15 and 17 into the space between the fingers. This socket loading function may be accomplished in many different ways, including manually. However, it is preferred to automate this function and use the loading mechanism 21. Various different loading mechanisms may be utilized, and the loading mechanism 21 is conventional and for that reason is not described in considerable detail herein. Generally, the loading mechanism 21 includes a chute 59 (FIG. 1) down which the sockets can move under the influence of gravity and a pusher 61 which is reciprocated by a linear actuator 63. In operation, one of the sockets 23 moves down the chute to a position in which it is near the righthand edges (as viewed in FIG. 1) of the fingers 15 and 17. When it is desired to load the socket between the fingers 15 and 17, the pusher 61 is moved to the left by the actuator 63 to force the socket between the fingers with the fingers 15 and 17 flexing apart as the socket is forced thereagainst by the pusher. To facilitate the resilient spreading of the fingers 15 and 17, the forward edge of the socket and/or the edges of the resilient fingers may be inclined so as to cam the fingers apart during the socket loading operation.

Regardless of how the socket 23 is loaded, when it is between the fingers 15 and 17, it rests on the shoulders 53 at the top of the cam surfaces 55. Thus, the fingers 15 and 17 form a socket retaining station for releasably retaining the socket 23. Although this is not essential, preferably the resilient fingers 15 and 17 are spaced so as to lightly resiliently grip the socket 23.

The spacing between the fingers 15 and 17 can be adjusted so that sockets 23 of varying widths can be accommodated. This can be accomplished, for example, by moving the finger supports 43 as permitted by the slots 46.

The position of the socket 23 along the shoulders 53 is controlled by an adjustable stop 65 (FIGS. 1 and 2). The stop 65 in the embodiment illustrated is in the form of a screw carried at the lower end of an arm 67 which is mounted on a shaft 69. The shaft 69 is rotatably mounted on one of the finger supports 43, and a second arm 71 is mounted on the shaft for rotation therewith. A microswitch 73 is also carried by the same finger support 43, and the arm 71 is engageable with the microswitch to operate the same.

In operation, as the socket 23 is moved to the left by the plunger 61 along the shoulders 53 as viewed in FIG. 1, it will ultimately strike the righthand end of the screw 65. After this movement of the socket 23 to the left can continue for a slight distance during which time the movement of the screw 65 is transmitted via the arm 67 and the shaft 69 to the shaft 71. When the arm 71 is moved a sufficient distance to actuate the microswitch 73, further movement of the arm 71 and hence of the screw 65 is prevented by the microswitch, whereupon movement of the socket 23 is arrested. Because the resilient fingers 15 and 17 lightly resiliently grip the socket 23, it cannot bounce off of the stop 65. In addition, a signal is derived by virtue of operation of the microswitch 73 indicating that the socket 23 is now in position at the socket retaining station and is ready for insertion. One function of the socket holding mechanism 19 is to pick up the socket 23 at the socket retaining station and move it downwardly to insert the pins 31 in the holes 33 of the printed circuit board 27. In the embodiment illustrated, the socket holding mechanism 19 is attached to and carried by a ram 75 which in turn is mounted on the platform 39. The ram 75 may be in the form of a hydraulic or pneumatic linear actuator having a linearly movable rod 77 (FIGS. 1-3) which is threaded into, or otherwise attached to, the socket holding mechanism 19.

Although the socket holding mechanism 19 may be of different constructions, in the embodiment illustrated, it includes a body 79 (FIGS. 3 and 4) which receives the threaded end of the rod 77. A set screw 81 locks the body 79 against rotation relative to the rod 77.

The socket holding mechanism also includes a receiver 83 having a surface defining a channel 85 and a mounting block 87 sized to be received within the channel. The receiver 83 is suitably attached to the body 79, and in the embodiment illustrated, this is accomplished by a stem 89 of the receiver being received in a downwardly opening bore 91 of the body 79. The stem 89 is held within the bore 91 by a set screw 93, the inner end of which is received within a notch 95 of the stem. A dowel 97 is received within bores 99 and 101 of the body 79 and the receiver 83, respectively, to control the angular position of the receiver relative to the body.

The mounting block 87 has two spaced grooves 103 therein which extend along the top and opposite sides of the mounting block. Each of the grooves 103 is adapted to receive a wire 105. If desired, the groove 103 may be formed entirely or partially within the receiver 83.

Each of the wires 105 is bent into a generally channel shaped configuration which includes a pair of spaced parallel legs 107 integrally joined by a web 109. The legs 107 are of sufficient length so that they extend beyond the lower surfaces of the mounting block 87 and the receiver 83 to define protrusions or prongs 111 having sharpened ends 113. Thus, with this construction, two of the wires 105 define four of the prongs 111.

The mounting block 87 is releasably attached to the receiver 83 to thereby securely hold the wires 105 in their respective grooves 103. Preferably, this is accomplished by a relatively easily releasable fastener, such as a screw 115 so that if one of the prongs 111 becomes bent, it can be quickly and easily replaced with a new wire 105.

The prongs 111 are sized and arranged to be received within four of the apertures 35, respectively, of the socket 23 at the socket retaining station. The resilient fingers 15 and 17 and the stop 65 hold the socket 23 in a predetermined position with the apertures 35 facing straight upwardly and the pins 31 facing straight downwardly so that upon movement of the socket holding mechanism 19 through the socket retaining station, the prongs 111 are inserted into the appropriate apertures 35.

The ram 75 mounts the socket holding mechanism 19 for linear movement from a first position through the socket retaining station toward the printed circuit board 27. In the first position, prior to beginning the downward stroke of the rod 77, the socket holding mechanism 19 is on the side of the socket retaining station remote from the printed circuit board 27, i.e. above the socket retaining station. The prongs 111 are parallel and extend perfectly parallel to the direction of movement of the socket holding mechanism, and this is vertically downwardly in the embodiment illustrated.

The socket inserter 11 can be controlled in various different ways, and except for the microswitch 73, the specific controls form no part of this invention. For example, the ram 75 can begin the downward stroke in response to a manual command or automatically after various requisite conditions have been met. In the embodiment illustrated, it is assumed that at least one of these conditions is the proper positioning of the socket 23 at the socket retaining station. A signal is derived from the microswitch 73 to indicate that the socket 23 is properly positioned.

The ram 75 moves the socket holding mechanism 19 downwardly continuously from the top of its stroke to the bottom of its stroke. As the prongs 111 enter the socket retaining station, they are forced into the corresponding apertures 35 of the socket 23. Although the fingers 15 and 17 are resilient, a known force is required to act downwardly on the cam surfaces 55 in order to separate the fingers sufficiently to release the socket 23 from the shoulders 53. The angle of the cam surfaces 55 and the resilience of the fingers 15 and 17 are selected in accordance with the force required to insert four of the prongs 111 into four of the apertures 35 so that the prongs can be fully inserted into their associated apertures before the socket 23 has traveled the full length of the cam surfaces 55. In other words, the socket 23 is firmly coupled to the socket holding mechanism 19 before the fingers 15 and 17 release the socket.

The downward stroke of the socket holding mechanism continues until the pins 31 are inserted into the holes 33 of the board 27. Thereafter, the socket 23 is held in the board while the ram 75 carries the socket holding mechanism 19 linearly on the return stroke. This holding action may be carried out by crimping of the pins 31 as discussed hereinabove with reference to FIG. 5. In any event, it may be necessary for the ram 75 to dwell for a short interval at the bottom of a stroke to allow time for attaching the socket 23 to the printed circuit board 27.

Although an exemplary embodiment of the invention has been shown and described, many modifications and substitutions can be made without necessarily departing from the spirit and scope of this invention.

I claim:

1. An apparatus for transporting a socket to a location on a base for attachment to the base wherein the socket is of the type having at least one aperture therein, said apparatus comprising:
   a supporting structure;
   a retaining means on the supporting structure for releasably retaining a socket at a socket retaining station with the aperture in the socket being at a predetermined location;
   a socket holding mechanism including at least one protrusion sized for entering said aperture and being releasably retained therein;
   means for mounting the socket holding mechanism for movement from a first position located on the side of the socket retaining station remote from the base along a path which extends through the socket retaining station and toward same location on said base and back toward the first position;
   said mounting means mounting the socket holding mechanism so that said protrusion moves through said predetermined location in moving along said path toward said location on said base and said retaining means releasably holding the socket at the retaining station sufficiently so that the protrusion is inserted into said aperture and releasably retained therein as the socket holding mechanism is moved through the retaining station whereby the socket holding mechanism removes the socket from the retaining means and delivers it to said location at said base for attachment to the base; and
   actuator means for moving said socket holding mechanism along said path.

2. An apparatus as defined in claim 1 wherein said retaining means is responsive to a force of a predetermined magnitude provided by said actuator means and the movement of said socket holding mechanism through the socket retaining station for releasing the socket from the retaining means for movement with the socket holding mechanism toward said location on the base.

3. An apparatus as defined in claim 1 wherein said retaining means includes at least first and second resilient fingers for retaining the socket at said socket retaining station, said resilient fingers terminating in free ends, respectively, which are spaced apart, at least a portion of said path lying between said resilient fingers and extending through the region between said free ends.

4. An apparatus as defined in claim 3 including first and second shoulders on said first and second fingers, respectively, on which the socket at said socket retaining station can rest.

5. An apparatus as defined in claim 1 wherein said protrusion is a first protrusion and said aperture is a first aperture, said socket includes second, third and fourth apertures and said socket holding mechanism includes second, third and fourth protrusions sized to be received in the second, third and fourth apertures, respectively, and adapted to be releasably retained therein in response to movement of the socket holding mechanism through the socket retaining station.

6. An apparatus as defined in claim 1 wherein said socket holding mechanism includes an elongated wire bent into a configuration having at least one leg and a web, a receiver having a surface defining a channel and a mounting block sized to be received in said channel, at least one of said channel and said mounting block having a groove therein adapted to at least partially receive said wire, and means for attaching the mounting block to the receiver with the mounting block being in said channel, said wire being in said groove with said leg projecting from said receiver and said mounting block, said mounting block and said receiver holding said web in said groove, and said leg defining said protrusion.

7. An apparatus for transporting a socket to a location on a base for attachment to the base comprising:
   a supporting structure;

first and second resilient fingers, each of said fingers having a free end;

means for attaching said resilient fingers to said supporting structure with said fingers extending from the supporting structure and with at least portions of said fingers being spaced apart;

said resilient fingers being for receiving and releasably retaining a socket therebetween at a socket retaining station;

a socket holding mechanism;

means for mounting said socket holding mechanism on said supporting structure for movement from a first position on the side of said socket retaining station remote from said base toward said base along a path which passes through said socket retaining station and between the free ends of said fingers;

said socket holding mechanism including means for releasably coupling the socket at the socket retaining station to the socket holding mechanism whereby movement of the socket holding mechanism along said path from the first position toward the base causes the socket holding mechanism to remove the socket from said socket retaining station and move it to said base; and actuator means for moving said socket holding mechanism along said path.

8. An apparatus as defined in claim 7 wherein said coupling means is responsive to movement of the socket holding mechanism at least partially through said socket retaining station for releasably attaching the socket at the socket retaining station to the socket holding mechanism.

9. An apparatus as defined in claim 7 wherein said fingers are resiliently movable away from each other to release the socket for movement away from the socket retaining station in response to the movement of the socket holding mechanism through the socket retaining station.

10. An apparatus as defined in claim 9 wherein said socket holding mechanism is engageable with the socket as the socket holding mechanism moves through the socket retaining station and said fingers are resiliently urged away from each other in response to such engagement of the socket holding mechanism and the socket and the subsequent movement of the socket holding mechanism through the socket retaining station.

11. An apparatus as defined in claim 9 including cam means on at least one of said fingers for moving said fingers away from each other to release the socket in response to the movement of the socket holding mechanism through the socket retaining station.

12. An apparatus as defined in claim 7 including first and second shoulders on the first and second fingers, respectively, on which the socket can rest.

13. An apparatus as defined in claim 12 wherein at least one of said shoulders has a cam surface on which at least a portion of the socket at the socket retaining station can rest whereby movement of the socket toward the free ends of said fingers cams at least the finger having said one shoulder thereon away from the other of said fingers to release the socket.

14. An apparatus as defined in claim 12 including means for moving a socket generally laterally from a location alongside of said fingers to said socket retaining station between said fingers and a stop for limiting such lateral movement of the socket, and said resilient fingers being adapted to resiliently grip the socket to prevent the socket from bouncing off of said stop.

15. Apparatus as defined in claim 7 including means for moving a socket generally laterally from a location alongside of said fingers to said socket retaining station between said fingers, a stop for limiting such lateral movement of the socket, and means responsive to the engagement of the socket and the stop for operating said actuating means to move the socket holding mechanism along said path.

16. An apparatus as defined in claim 7 wherein said attaching means includes first and second finger supports, means to attach the first and second fingers to the first and second finger supports respectively, and means for attaching the finger supports to the supporting structure at different locations to vary the spacing between said resilient fingers.

17. An apparatus as defined in claim 7 wherein said path is linear and said socket holding mechanism in said first position thereof lies along a line extending from a location to a location about said fingers between said fingers.

* * * * *